United States Patent
Zhang et al.

(10) Patent No.: US 10,645,499 B2
(45) Date of Patent: May 5, 2020

(54) MEMS MICROPHONE

(71) Applicant: AAC ACOUSTIC TECHNOLOGIES (SHENZHEN) CO., LTD, Shenzhen (CN)

(72) Inventors: Rui Zhang, Shenzhen (CN); Jinyu Zhang, Shenzhen (CN); Ting Kang, Shenzhen (CN)

(73) Assignee: AAC Acoustic Technologies (Shenzhen) Co., Ltd., ShenZhen (CN)

( * ) Notice: Subject to any disclaimer, the term of this patent is extended or adjusted under 35 U.S.C. 154(b) by 0 days.

(21) Appl. No.: 16/234,791

(22) Filed: Dec. 28, 2018

(65) Prior Publication Data

US 2019/0246215 A1  Aug. 8, 2019

(30) Foreign Application Priority Data

Feb. 6, 2018 (CN) ............ 2018 2 0213684 U

(51) Int. Cl.
| | |
|---|---|
| *H04R 19/04* | (2006.01) |
| *H04R 19/00* | (2006.01) |
| *H04R 1/04* | (2006.01) |
| *B81B 7/00* | (2006.01) |
| *H04R 1/22* | (2006.01) |

(52) U.S. Cl.
CPC ............ *H04R 19/04* (2013.01); *B81B 7/0061* (2013.01); *H04R 1/04* (2013.01); *H04R 19/005* (2013.01); *B81B 2201/0257* (2013.01); *B81B 2203/0127* (2013.01); *H04R 1/222* (2013.01); *H04R 2201/003* (2013.01)

(58) Field of Classification Search
CPC ........ H04R 19/04; H04R 1/04; H04R 19/005; H04R 1/222; H04R 2201/003; B81B 7/0061; B81B 2203/0127; B81B 2201/0257

See application file for complete search history.

(56) References Cited

U.S. PATENT DOCUMENTS

| | | | | |
|---|---|---|---|---|
| 4,776,019 A | * | 10/1988 | Miyatake ............ | G01D 5/2417 181/158 |
| 5,677,965 A | * | 10/1997 | Moret ................. | H04R 19/005 381/113 |
| 7,885,423 B2 | * | 2/2011 | Weigold ............... | B81B 3/0037 381/174 |

(Continued)

*Primary Examiner* — Oyesola C Ojo
(74) *Attorney, Agent, or Firm* — IPro, PLLC; Na Xu

(57) ABSTRACT

An MEMS microphone, including a base having a back cavity, and a capacitor system fixedly supported on the base, the capacitor system including a diaphragm and a back-plate spaced from the diaphragm. The diaphragm is provided with a venting portion passing through an edge thereof, and the base includes an inner side surface surrounding the back cavity and at least one venting groove formed by recessing from an inner side surface in a direction away from the back cavity direction. The at least one venting groove is disposed corresponding to the venting portion and is in communication with the venting portion and the back cavity, respectively. The base is provided with a venting groove, so that the back cavity has larger space for venting, and the airflow can easily pass through, thereby reducing the probability of breaking the diaphragm. Thus, the MEMS microphone can have a higher reliability.

5 Claims, 4 Drawing Sheets

(56) References Cited

U.S. PATENT DOCUMENTS

| | | | |
|---|---|---|---|
| 8,104,354 B2* | 1/2012 | Hsu | G01L 9/0073 |
| | | | 29/592.1 |
| 10,266,393 B2* | 4/2019 | Chung | G01L 9/0073 |
| 2006/0210106 A1* | 9/2006 | Pedersen | H04R 19/005 |
| | | | 381/355 |
| 2008/0123876 A1* | 5/2008 | Sato | H04R 19/016 |
| | | | 381/174 |
| 2008/0181437 A1* | 7/2008 | Suzuki | H04R 19/016 |
| | | | 381/191 |
| 2013/0161702 A1* | 6/2013 | Chen | B81C 1/00246 |
| | | | 257/254 |
| 2014/0247954 A1* | 9/2014 | Hall | H04R 1/342 |
| | | | 381/92 |

\* cited by examiner

A–A

MEMS MICROPHONE

CROSS-REFERENCE TO RELATED APPLICATIONS

The present application claims priority to Chinese Patent Application No. 201820213684.7, filed on Feb. 6, 2018, the content of which is incorporated herein by reference in its entirety.

TECHNICAL FIELD

The present disclosure relates to the field of electroacoustic conversion, and in particular, to a MEMS microphone.

BACKGROUND

In recent years, mobile communication technologies have been rapidly developed, and consumers are increasingly using mobile communication devices, such as portable phones, portable phones with Internet access, personal digital assistants, or other devices that communicate with a dedicated communication network, among which a microphone is an important component, especially a MEMS microphone.

A Micro-Electro-Mechanical System (MEMS) microphone is an electroacoustic transducer manufactured by micro-machining technology, which has the characteristics of small volume, good frequency response and low noise. With the development of small and light electronic devices, MEMS microphones are increasingly applied in these devices.

A MEMS microphone in the related art includes a base having a back cavity, a diaphragm and a back-plate fixedly supported on the base. The diaphragm and the back-plate are disposed opposite to and spaced from each other to form a capacitor structure. The diaphragm is provided with a venting portion at an edge region thereof, and when the diaphragm encounters a large airflow, the diaphragm moves and the airflow portion allows the airflow to quickly pass through the diaphragm, thereby reducing the probability of diaphragm breaking.

However, in the related art, when the airflow encountered by the diaphragm has a direction from a side of the diaphragm facing away from the back cavity toward the back cavity, the diaphragm moves toward the back cavity, and a narrow gas path in the back cavity causes poor air leakage due to limitation of the base, and thus it is easy to cause the diaphragm to break.

Therefore, it is necessary to provide an improved MEMS microphone to solve the above problems.

BRIEF DESCRIPTION OF DRAWINGS

In order to illustrate technical solutions in embodiments of the present disclosure, the accompanying drawings used in the embodiments are introduced as follows. It should be noted that the drawings described as follows are merely part of the embodiments of the present disclosure, other drawings can also be acquired by those skilled in the art without paying creative efforts.

DESCRIPTION OF EMBODIMENTS

In order to make the purpose, technical solutions, and advantages of the embodiments of the present disclosure to be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

Figure 1:
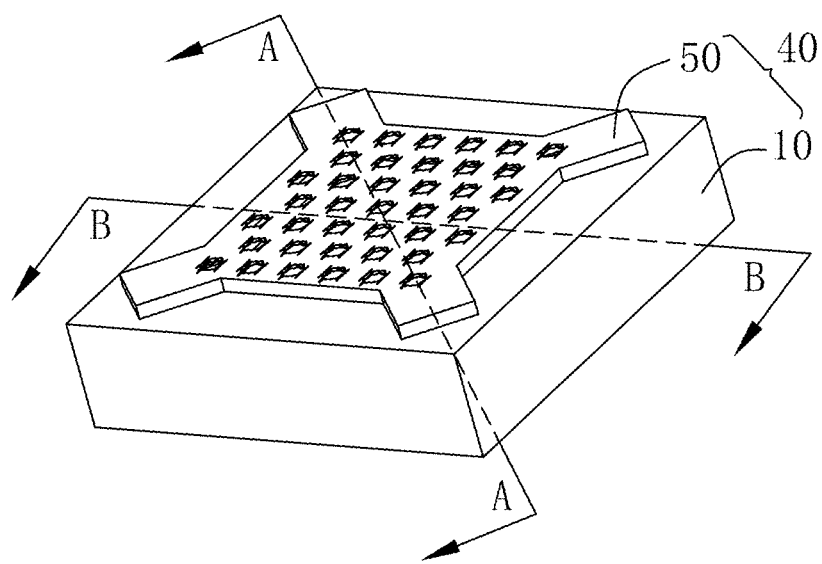
FIG. 1 is a schematic view of an overall structure of an MEMS microphone according to an embodiment of the present disclosure.
Figure 2:
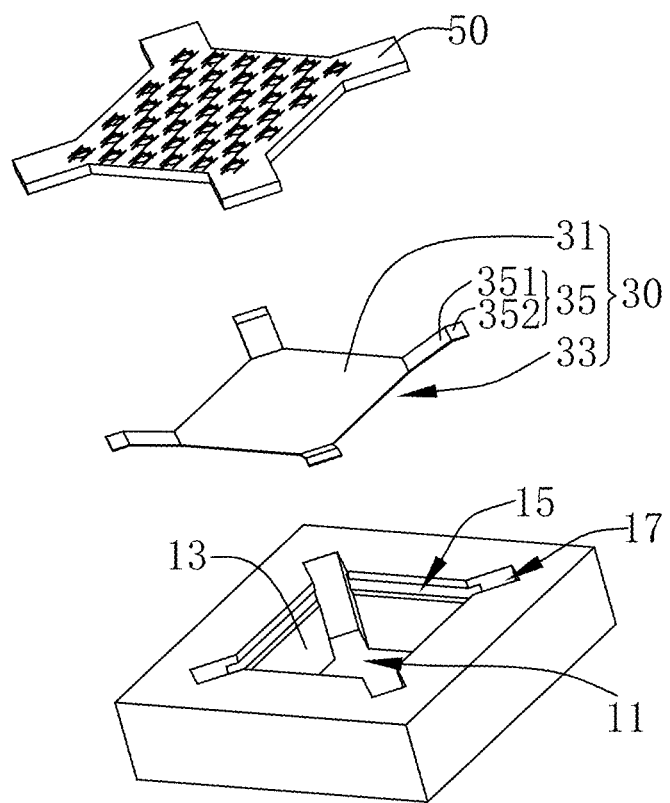
FIG. 2 is a schematic exploded view of an MEMS microphone according to an embodiment of the present disclosure.

FIG. 1 is a schematic view of an overall structure of an MEMS microphone according to an embodiment of the present disclosure, and FIG. 2 is a schematic exploded view of an MEMS microphone according to an embodiment of the present disclosure. With reference to FIG. 1 and FIG. 2, the present disclosure provides an MEMS microphone 100 including a base 10 having a back cavity 11, and a capacitor system 40 fixedly supported on the base 10. Herein, the capacitor system 40 includes a diaphragm 30 and a back-plate 50 spaced apart from the diaphragm.

The base 10 is made of a semiconductor material, such as silicon.

Figure 3:
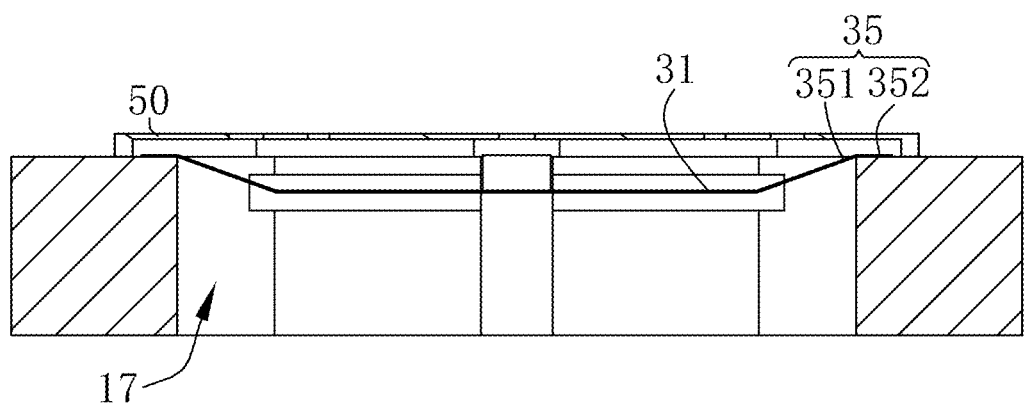
FIG. 3 is a cross-sectional view taken along line A-A of FIG. 1.
Figure 4:
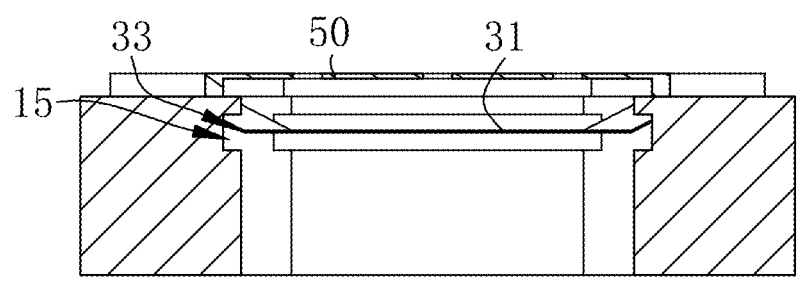
FIG. 4 is a cross-sectional view taken along line B-B of FIG. 1.

FIG. 3 is a cross-sectional view taken along line A-A of FIG. 1, and FIG. 4 is a cross-sectional view taken along line B-B of FIG. 1. With reference to FIG. 3 and FIG. 4, the base 10 includes a back cavity 11, an inner side surface 13 enclosing to form the back cavity 11, and a venting groove 15 and a recess 17 formed recessing from the inner side surface 13 in a direction facing away from the back cavity 11. The venting groove 15 is arranged between adjacent recesses 17.

The back cavity 11 penetrates through the base 10.

In one embodiment, the back cavity 11 may be formed by a bulk-silicon micromachining process or etching.

The diaphragm 30 includes a body portion 31 shaped as a rectangle, and a plurality of extensions 35 extending from corners of the body portion 31 toward the back-plate 50. The plurality of extensions 35 is spaced apart from one another. The diaphragm 30 is fixed to the base 10 by the extensions 35. Optionally, four extensions 35 are provided. The venting portion 33 is formed between adjacent extensions 35.

The venting groove 15 of the base 10 is disposed corresponding to the venting portion 33 of the diaphragm 30, and is in communication with the venting portion 33 and the back cavity 11, respectively.

When the body portion 31 moves toward the back cavity 11 under a force, an orthographic projection of the body portion 31 in the direction perpendicular to the vibration direction toward the venting groove 15 is at least partially located in the venting groove 15, that is, when the body portion 31 moves toward the back cavity 11 under a force, the venting portion 33 is in communication with the venting groove 15.

The venting portion 33 is used for circulation of the airflow to prevent the diaphragm from breaking.

The extension 35 includes a first portion 351 extending from the body portion 31, and a second portion 352 extending from the first portion 351.

The second portion 352 is fixed to the base 10, and the diaphragm 30 is thereby fixed to the base 10.

When a side of the diaphragm 30 close to the back cavity 11 encounters a strong airflow, the diaphragm 30 moves in a direction facing away from the back cavity 11. Since outer space of the back cavity 11 is open and unobstructed, the airflow can quickly pass through the periphery of the diaphragm 30, and the probability of breaking the diaphragm 30 is small.

When a side of the diaphragm 30 facing away from the back cavity 11 encounters a strong airflow, the diaphragm 30 moves toward the interior of the back cavity 11. Since the venting groove 15 increases a volume of the back cavity 11, the airflow can pass through more easily. The airflow passes through the venting portion 31 and then flows to the venting groove 15 having a larger space. Then the airflow flows out from the back cavity 11 after the resistance is reduced by the venting groove 15. In this way, the force of the airflow applied on the diaphragm 30 is reduced, thereby reducing the probability of breaking the diaphragm 30.

The inner side surface 13 is enclosed as a rectangular structure, that is, the cross-section of the inner side surface 13 in a direction perpendicular to the vibration direction of the diaphragm has a rectangular shape. The recess 17 is located at a corner of the inner side surface 13 and is disposed corresponding to the extension 35 of the diaphragm 30. Therefore, during vibration of the diaphragm 30, the recess 17 can provide space to the extension 35.

Four venting grooves 15 are provided in this embodiment, and distributed in a rectangular array. In other embodiments, the venting groove 15 may have an arc-shaped structure, and a plurality of venting grooves 15 may be provided and spaced from one other and distributed in an annular array.

Four recesses 17 are provided and formed at four corners of the side wall 13, and the recesses 17 are in communication with the venting grooves 15.

Compared with the related art, the MEMS microphone 100 in embodiments of the present disclosure has following beneficial effects. When a side of the diaphragm 30 facing away from the back cavity 11 encounters a strong airflow and the diaphragm 30 therefore moves toward back cavity 11, the venting groove 15 can allow the back cavity 11 to be increased in volume, and the airflow can pass through more easily. The airflow passes through the venting portion 31 and then flows to the venting groove 15 having a larger space. Then the airflow flows out from the back cavity 11 after the resistance is reduced by the venting groove 15. In this way, the impact duration of the airflow applied on the diaphragm 30 is reduced, thereby reducing the probability of breaking the diaphragm 30. When a side of the diaphragm 30 close to the back cavity 11 encounters a strong airflow and therefore the diaphragm 30 moves in a direction facing away from the back cavity 11, since outer space in this direction is open and unobstructed, the airflow can pass through quickly, and the probability of breaking the diaphragm 30 is small. Thus, the structure described above can improve reliability of the MEMS microphone 100.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

What is claimed is:

1. A micro-electro-mechanical system (MEMS) microphone, comprising:
   a base having a back cavity; and
   a capacitor system fixedly supported on the base, the capacitor system comprising a diaphragm and a back-plate spaced apart from the diaphragm,
   wherein the diaphragm is provided with a venting portion penetrating through an edge thereof, the base comprises an inner side surface enclosing the back cavity and at least one venting groove recessed from the inner side surface in a direction facing away from the back cavity, the at least one venting groove and the venting portion are disposed correspondingly to each other and the at least one venting groove is in communication with the venting portion and the back cavity, respectively;
   wherein the diaphragm comprises a body portion located in the back cavity and a plurality of extensions extending from the body portion toward the back-plate, the plurality of extensions is spaced apart from one another, and the diaphragm is fixed to the base by the plurality of extensions;
   wherein the base further comprises at least one recess recessed from the inner side surface toward the direction facing away from the back cavity, the at least one recess and the plurality of extensions are disposed correspondingly to each other and used to provide space for the plurality of extensions during vibration.

2. The MEMS microphone according to claim 1, wherein the venting portion is formed between adjacent ones of the plurality of extensions.

3. The MEMS microphone according to claim 2, wherein four extensions are provided, and the four extensions are equidistantly spaced from one another.

4. The MEMS microphone according to claim 3, wherein the body portion has a rectangular shape, and each of the four extensions extends outward from a corner of the body portion.

5. The MEMS microphone according to claim 4, wherein the inner side surface has a rectangular cross-section in a direction perpendicular to a vibration direction of the diaphragm, and the at least one recess is located at a corner of the inner side surface.

* * * * *